United States Patent [19]

Maejima

[11] Patent Number: 5,699,017
[45] Date of Patent: Dec. 16, 1997

[54] AUTOMATIC GAIN CONTROL CIRCUIT

[75] Inventor: Toshio Maejima, Shizuoka-ken, Japan

[73] Assignee: Yamaha Corporation, Hamamatsu, Japan

[21] Appl. No.: 624,738

[22] Filed: Mar. 26, 1996

[30] Foreign Application Priority Data

Mar. 27, 1995 [JP] Japan ................................. 7-093082

[51] Int. Cl.$^6$ ................................................ H03G 3/30
[52] U.S. Cl. ................................ 330/280; 330/284
[58] Field of Search ................................ 330/138, 145, 330/280, 284

[56] References Cited

U.S. PATENT DOCUMENTS

| 3,849,734 | 11/1974 | Grass | 330/145 X |
| 4,933,647 | 6/1990 | Dea et al. | 330/284 |
| 5,001,440 | 3/1991 | Zerod | 330/284 |

*Primary Examiner*—James B. Mullins
*Attorney, Agent, or Firm*—Loeb & Loeb LLP

[57] ABSTRACT

An automatic gain control circuit is provided, which has minimum variations in the output signal level even with the presence of variations in component parts thereof and the temperature dependency of component parts thereof and can therefore dispense with the use of an additional amplifier circuit for adjusting the output level. An input signal-attenuating circuit attenuates the level of an input signal to a voltage amplifier circuit. An output level-detecting circuit detects the voltage level of an output signal from the voltage amplifier circuit to thereby carry out feedback control by controlling the attenuating characteristic of the input signal-attenuating circuit in response to the detected voltage of the output signal such that the voltage level of the output signal from the voltage amplifier circuit is maintained at a constant level. The output level-detecting circuit is comprised of a differential amplifier circuit which detects and amplifies the difference between a predetermined reference voltage and the voltage of the output signal from the voltage amplifier circuit.

2 Claims, 3 Drawing Sheets

AUTOMATIC GAIN CONTROL CIRCUIT

BACKGROUND OF THE INVENTION

1. Field of the Invention

This invention relates to an automatic gain control circuit which controls the amplitude of an output signal voltage from an amplifier circuit to a constant level.

2. Prior Art

Conventionally, an automatic gain control circuit as shown in FIG. 1 is known, which has a voltage amplifier circuit 21 formed of an operational amplifier OP, and resistances R2, R3 and a capacitor C1. An input resistance R1 is connected to an input terminal of the voltage amplifier circuit 21. An NMOS transistor M is connected between the input terminal of the voltage amplifier circuit 21 and a reference voltage terminal VCOM. The input resistance R1 and the NMOS transistor M constitute an input signal-attenuating circuit 22. Connected to an output terminal of the voltage amplifier circuit 21 is an output level-detecting circuit 23 which is formed of a diode D, a resistance R4 and a capacitor C2 and controls the conductivity or conductance of the NMOS transistor M.

In the known automatic gain control circuit shown in FIG. 1, so long as the amplitude of an output signal from the voltage amplifier circuit 21 is below a threshold voltage VF of the diode D, the NMOS transistor M remains off. In this condition, an input signal to the input signal-attenuating circuit 22 is not attenuated thereby and amplified by the voltage amplifier circuit 21 with a gain of 1+R2/R3.

When the output signal amplitude exceeds the threshold voltage VF of the diode D, the diode turns on so that the capacitor C2 is charged with a time constant determined by the capacitor C2 and the resistance R4. When the charged voltage exceeds a threshold voltage Vth of the NMOS transistor M, the NMOS transistor M turns on. Accordingly, the input signal is divided in voltage by the resistance R1 and the on-state resistance of the NMOS transistor M, i.e. attenuated. The attenuated input signal is applied to the voltage amplifier circuit 21. Thus, gain control is carried out.

The known automatic gain control circuit, however, has the following disadvantages:

a) The level of the output signal depends on the threshold voltage Vth of the NMOS transistor M and the threshold voltage VF of the diode D. As a result, the known automatic gain control circuit cannot obtain a desired output signal level by itself. To obtain a desired output signal level, the automatic gain control circuit requires the use of an additional amplifier circuit connected to the output thereof, for adjusting the output signal level.

b) Variations in the output signal level inherently exist due to variations in the threshold voltage Vth of the NMOS transistor M.

c) The output signal level also varies with a change in the temperature due to temperature dependency of the threshold voltage Vth of the NMOS transistor M and the threshold voltage VF of the diode.

SUMMARY OF THE INVENTION

It is an object of the invention to provide an automatic gain control circuit which has minimum variations in the output signal level even with the presence of variations in component parts thereof and the temperature dependency of component parts thereof and can therefore dispense with the use of an additional amplifier circuit for adjusting the output level.

To attain the above object, the present invention provides an automatic gain control circuit comprising an input signal-attenuating circuit that attenuates a voltage level of an input signal, the input signal-attenuating circuit having a variable attenuating characteristic, a voltage amplifier circuit that amplifies the input signal attenuated by the input signal-attenuating circuit, and an output level-detecting circuit that detects voltage of an output signal from the voltage amplifier circuit, and that controls the attenuating characteristic of the input signal-attenuating circuit in response to the detected voltage of the output signal in a manner such that a voltage level of the output signal from the voltage amplifier circuit is maintained at a constant level.

The output level-detecting circuit is comprised of a differential amplifier circuit which detects and amplifies a difference between a predetermined reference voltage and the voltage of the output signal from the voltage amplifier circuit.

In a preferred embodiment of the invention, the automatic gain control circuit is comprised of a voltage amplifier circuit including an operational amplifier having an input terminal and an output terminal, a direct current bias terminal that applies a predetermined direct current bias to the voltage amplifier circuit, an input signal-attenuating circuit including an input resistance serially connected to the input terminal of the voltage amplifier circuit, and a MOS transistor connected between the input terminal of the voltage amplifier circuit and the direct current bias terminal, the MOS transistor having a gate, a current mirror type differential amplifier circuit having an input terminal thereof connected to the output terminal of the voltage amplifier circuit, and another input terminal thereof disposed to be supplied with a predetermined reference voltage which is lower than a voltage of the predetermined direct current bias from the direct current bias terminal, the differential amplifier circuit having an output terminal for outputting an output which is inverted when a voltage level of the output signal from the voltage amplifier circuit lowers below the predetermined reference voltage, and a time constant circuit having an input terminal thereof connected to the output terminal of the differential amplifier circuit, and an output terminal thereof connected to the gate of the MOS transistor of the input signal-attenuating circuit. The time constant circuit is responsive to the output from the differential amplifier circuit, that delivers a control signal to the gate of the MOS transistor of the input signal-attenuating circuit to thereby cause progressive decrease of on-state resistance of the MOS transistor when the output from the differential amplifier circuit is inverted.

Preferably, the automatic gain control circuit according to the preferred embodiment further includes a back bias terminal for supplying a back bias to a substrate region of the MOS transistor of the input signal-attenuating circuit.

The above and other objects, features, and advantages of the invention will become more apparent from the following detailed description taken in conjunction with the accompanying drawings.

DETAILED DESCRIPTION

The invention will be described in detail with reference to drawings showing an embodiment thereof.

Figure 1:
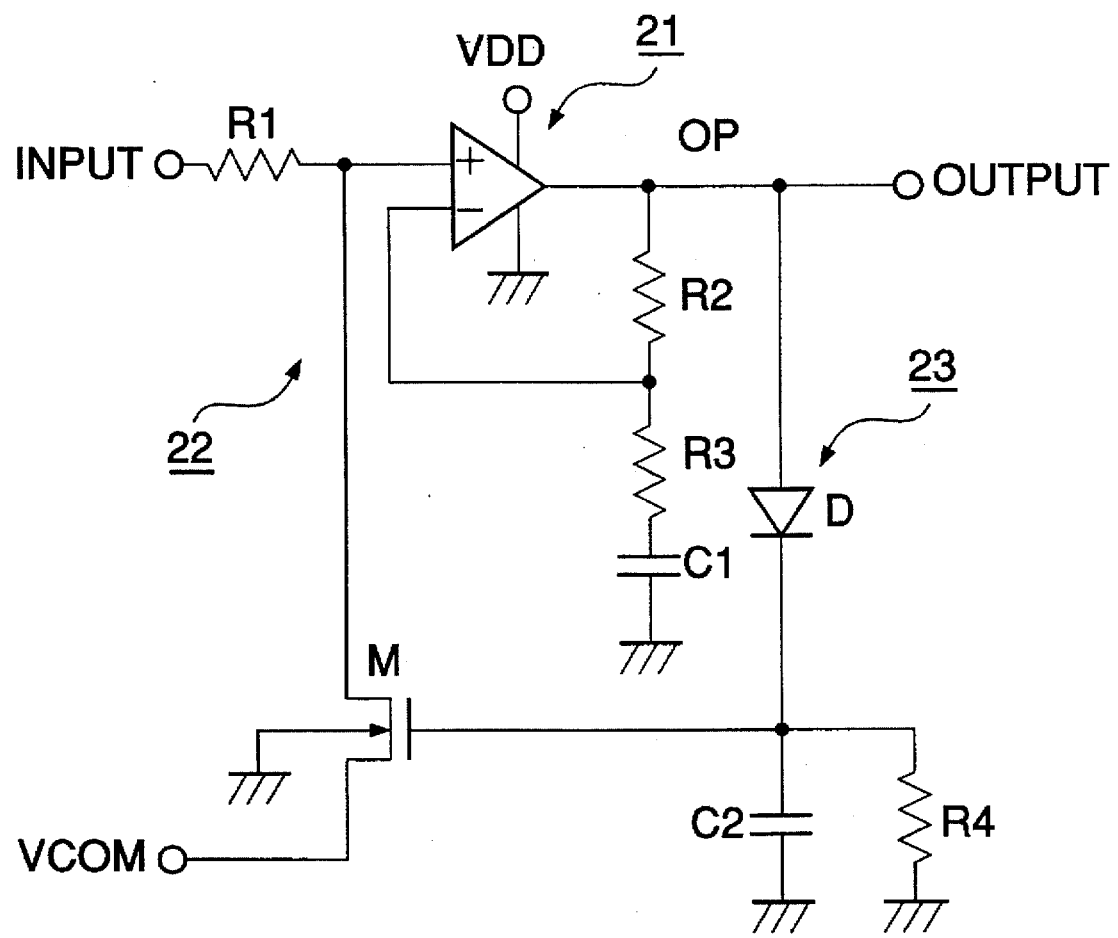
FIG. 1 is a circuit diagram showing the arrangement of a conventional automatic gain control circuit.
Figure 2:
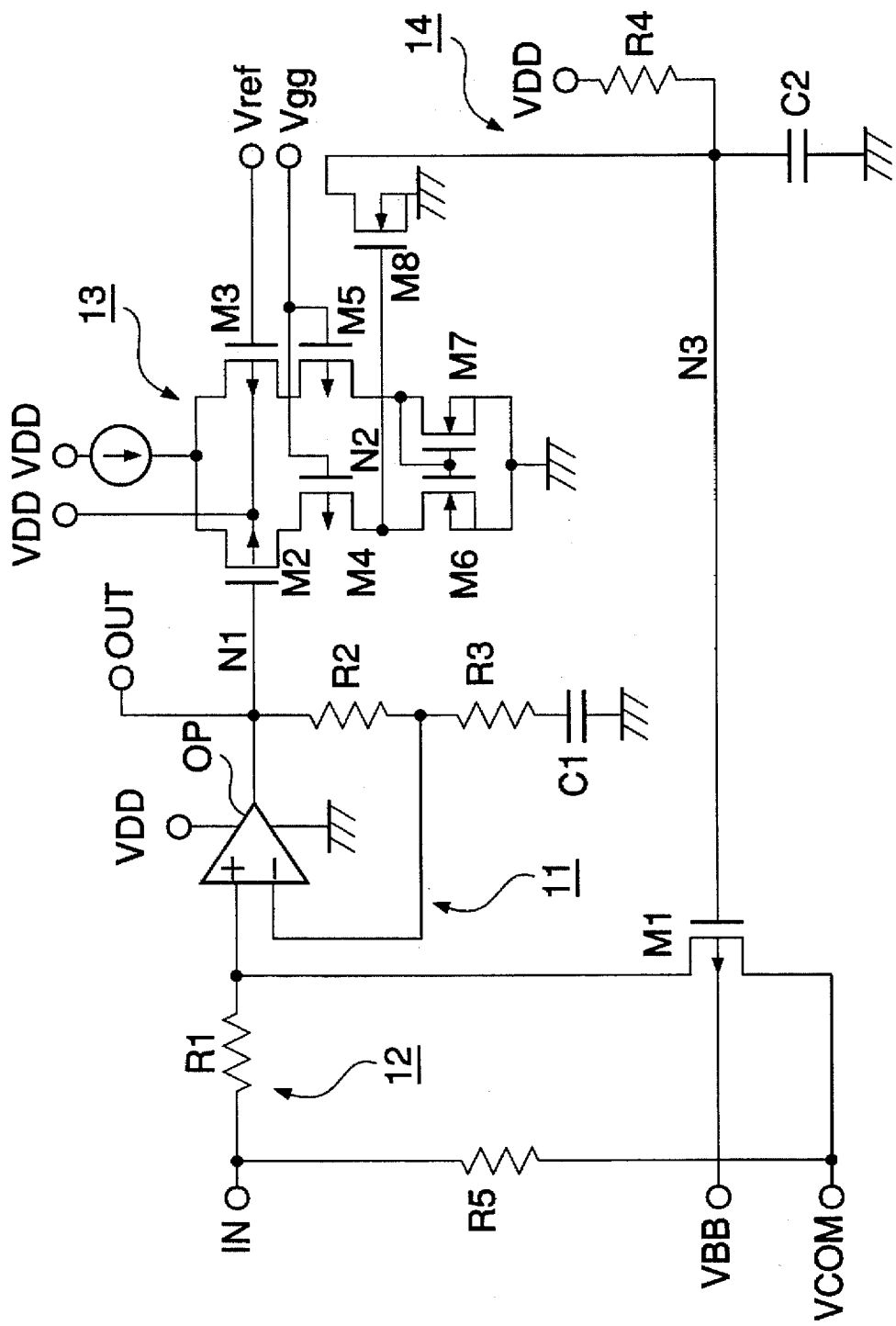
FIG. 2 is a circuit diagram showing the arrangement of an automatic gain control circuit according to an embodiment of the present invention.

FIG. 2 shows the arrangement of an automatic gain control circuit according to an embodiment of the invention. The automatic gain control circuit is comprised of a voltage amplifier circuit 11, and an input signal-attenuating circuit 12 which selectively attenuates the level of an input signal to the voltage amplifier circuit 11. The automatic gain control circuit further includes a differential amplifier circuit 13 and a time constant circuit 14, which constitute an output level-detecting circuit which detects the level of an output signal from the voltage amplifier circuit 11 and feedback-controls the input signal-attenuating circuit 12 in response to the detected output signal level.

The voltage amplifier circuit 11 is comprised of an operational amplifier OP which has a noninverting input terminal thereof connected to a signal input terminal IN by way of an input resistance R1, and a feedback circuit formed of resistances R2, R3 and a capacitor C1 connected between an output terminal N1 and an inverting input terminal of the operational amplifier OP. The feedback circuit determines the gain of the voltage amplifier circuit 11.

A PMOS transistor M1 is connected between an input terminal of the voltage amplifier circuit 11, i.e. the noninverting input terminal of the operational amplifier OP, and an intermediate voltage terminal VCOM which supplies an intermediate voltage VCOM determining a direct current bias point for the circuit. The PMOS transistor M1 and the input resistance R1 constitute the input signal-attenuating circuit 12 which has a variable attenuating characteristic. A positive back bias VBB is applied to a substrate region of the PMOS transistor M1 through a back bias terminal VBB. The intermediate voltage VCOM is set to a predetermined value VDD/2, where VDD represents a power source voltage supplied to the time constant circuit 14.

A resistance R5 is connected between the signal input terminal IN and the intermediate voltage terminal VCOM.

The output terminal N1 of the voltage amplifier circuit 11 is directly connected to a signal output terminal OUT. The differential amplifier circuit 13 is provided to detect voltage level at the output terminal N1. The differential amplifier circuit 13 is a current mirror type differential amplifier which is comprised of a driver formed by a pair of PMOS transistors M2 and M3, and a pair of NMOS transistors M6, M7 which constitute an active load. The PMOS transistor M2 of the driver has a gate thereof connected to the output terminal N1 while the PMOS transistor M3 has a gate thereof supplied with a reference voltage Vref. This reference voltage Vref is set to a desired level which is below the intermediate voltage VCOM.

In the present embodiment, PMOS transistors M4, M5 are serially connected, respectively, to the PMOS transistors M2, M3 forming the driver. A gate voltage Vgg is applied to these PMOS transistors M4, M5 such that they serve as resistances for limiting the attenuation of the amplitude of the output which can be caused by supersaturation of the MOS transistor M2.

The time constant circuit 14 is comprised of a resistance R4 and a capacitor C2 which are connected in series between a power source VDD and ground, and an NMOS transistor M8 which is disposed to selectively cause a short across the capacitor C2. The NMOS transistor M8 has a gate thereof connected to an output terminal N2 of the differential amplifier circuit 13 such that the NMOS transistor M8 is on-off controlled in response to the level of an output signal from the differential amplifier circuit 13. A connection node or junction between the resistance R4 and the capacitor C2 forms an output terminal N3 of the time constant circuit 14 which is connected to a gate of the PMOS transistor M1 of the input signal-attenuating circuit 12 such that the on-state resistance of the PMOS transistor M1 is controlled in response to an output signal from the time constant circuit 14.

The operation of the automatic gain control circuit constructed as above will now be described:

When no alternating current input signal is fed to the automatic gain control circuit, the potential at the signal input terminal IN is held at a level as high as the intermediate voltage VCOM so that the level at the output terminal N1 of the voltage amplifier circuit 11, namely, the level at the signal output terminal OUT is also held at a level as high as the intermediate voltage VCOM In this condition, the level at the output terminal N2 of the differential amplifier circuit 13, namely, the potential at the gate of the NMOS transistor M8 is at a low level "L" and accordingly the NMOS transistor M8 is held off. Consequently, the capacitor C2 is charged to a high level "H" (=VDD) and accordingly the output terminal N3 of the time constant circuit 14, namely, the gate of the PMOS transistor M1 is at a level "H" and hence the PMOS transistor M1 is held off.

Figure 3A:
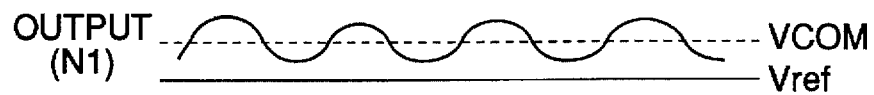
FIG. 3A is a waveform view showing voltage levels at essential parts of the circuit of FIG. 2, assumed when the amplitude of an output signal from the circuit is small.
Figure 3B:
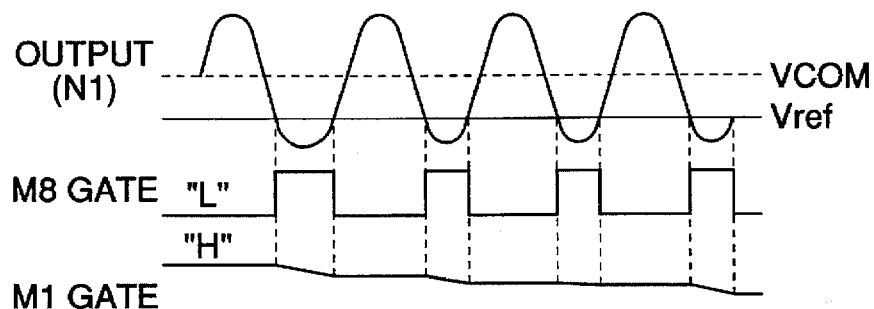
FIG. 3B is a similar view to FIG. 3A, showing voltage levels assumed when the output signal amplitude is large.
Figure 3C:
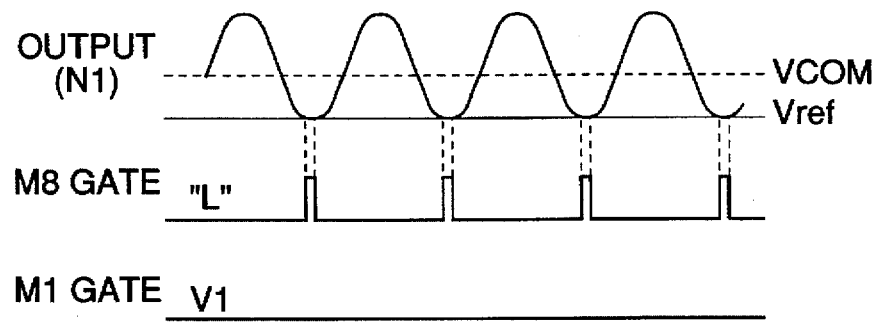
FIG. 3C is a similar view to FIG. 3A, showing voltage levels assumed when the output signal amplitude has become stabilized to a constant level.

When an alternating current input signal is fed to the automatic gain control circuit, essential component parts assume voltage waveforms as shown in FIG. 3A so long as the amplitude of the output signal is small. The output of the differential amplifier circuit 13 is not inverted so long as the voltage at the output terminal N1 of the voltage amplifier circuit 11 is above the reference voltage Vref, and accordingly the PMOS transistor M1 is held off. Consequently, the input signal is applied to the voltage amplifier circuit 11 without being attenuated, whereby the gain of the automatic gain control circuit becomes the maximum, i.e. 1+R2/R3.

When the amplitude of the output signal increases to such a level that a lower peak of the output signal falls below the reference voltage VREF as shown in FIG. 2B, the PMOS transistor M2 of the differential amplifier circuit 13 turns on so that the output from the circuit 13 is inverted, whereby the potential at the gate of the NMOS transistor M8 goes high to turn the NMOS transistor M8 on. Accordingly, the potential at the gate of the PMOS transistor M1 lowers at a rate corresponding to the time constant determined by the resistance R4 and the capacitor C2 of the time constant circuit 14, whereby feedback control is carried out such that the on-state resistance of the PMOS transistor M1 progressively decreases to vary the voltage division ratio between the input terminal R1 and the PMOS transistor M1 to progressively decrease the amplitude of the input signal applied to the voltage amplifier circuit 11.

When the amplitude of the input signal becomes smaller such that the lower peak of the output signal falls above the reference voltage VREF, the PMOS transistor M2 of the differential amplifier circuit 13 turns off. Accordingly, the NMOS transistor M8 turns off so that the gate potential of the PMOS transistor M1 increases to increase the on-state resistance of the PMOS transistor M1. Consequently, the amplitude of the input signal applied to the voltage amplifier circuit 11 increases, thus increasing the amplitude of the output signal.

By the above operation, the automatic gain control circuit is brought into a stable state wherein feedback control is carried out as shown in FIG. 2C such that the lower peak of the voltage at the output terminal N1 of the voltage amplifier circuit 11 becomes almost equal to the reference voltage Vref, that is, the level of the output signal is held constant even when the level of the input signal varies. The gate of the PMOS transistor M1 eventually assumes a voltage value V1 which is determined by the switching action and on-state resistance of the NMOS transistor M8, the time constant determined by the resistance R4 and the capacitor C2, and characteristics of the PMOS transistor M1.

In the automatic gain control circuit according to the present embodiment, if the time constant of the time constant circuit 14 is excessively small, the on-state resistance of the PMOS transistor M1 sharply changes, resulting in increased distortion of the output waveform. If the time constant by the resistance R4 and the capacitor C2 is set to a sufficiently large value, the distortion rate of the automatic gain control circuit is determined by the linearity of the on-state resistance of the PMOS transistor M1. In the present embodiment, the back bias VBB is applied to the substrate region of the PMOS transistor M1 in addition to the source voltage to thereby improve the linearity of the on-state resistance. This is based on the following ground:

In general, the relationship between the drain current Id and drain voltage Vd of a MOS transistor is expressed by the following formula:

$$Id = (\mu C0\ W/L)\ \{(Vg-Vth)Vd - Vd2/2\}$$

where $\mu$ represents charge transfer velocity, C0 gate capacitance, W/L the ratio of gate width to gate length, Vg gate voltage, and Vth gate threshold voltage.

In the above formula, the voltage and current values are absolute values to apply the formula to PMOS transistors and NMOS transistors commonly.

It will be understood from the formula that to improve the linearity of the on-state resistance of a MOS transistor, it is effective either (a) to increase the value (Vg–Vth) or (b) to make the value Vd as small as possible.

In the present embodiment, the back bias VBB is applied to the substrate region of the PMOS transistor M1 apart from the intermediate voltage VCOM applied to the source of the PMOS transistor M1 so that the effective threshold voltage Vth can be made small by selecting a desired back bias VBB. Therefore, in actual use the value (Vg–Vth) can be set to a large value to thereby improve the linearity of the on-state resistance of the PMOS transistor M1 so that the circuit has a small distortion rate characteristic.

As described above, according to the present embodiment, the differential amplifier circuit 13 is employed as the output level-detecting circuit for detecting the output signal level of the voltage amplifier circuit 11 to carry out the feedback control. As a result, the output signal level can be set to a desired value by selecting the reference voltage Vref applied to the differential amplifier circuit 13. In this manner, as is different from the conventional automatic gain control circuit which detects the output level of the voltage amplifier circuit by means of a diode, in the automatic gain control circuit according to the present embodiment, the feedback gain is obtained by the differential amplifier circuit 13 to thereby reduce adverse influence of variations in the threshold value of the PMOS transistor M1 and the temperature dependency of the same upon the output signal level.

Further, according to the present embodiment, the amplitude of the output signal is not limited by the detection of the output level, nor is it necessary to additionally provide an amplifier circuit connected to the output of the automatic gain control circuit, for adjusting the output level. As a result, for example, if the automatic gain control circuit according to the present embodiment is implemented in the form of an LSI to be used as an amplifier for microphones which outputs a voltage within a range from 10 to 100 mV, the omission of such an output level-adjusting amplifier is advantageous in designing the amplifier compact in size, low in power consumption as well as low in manufacturing cost.

As described heretofore, according to the invention, by virtue of the use of a differential amplifier circuit as an output level-detecting circuit, the automatic gain control circuit can have minimum variations in the output signal level due to variations in component parts thereof and temperature dependency of the same while dispensing with the provision of an output level-adjusting amplifier circuit connected to the output of the automatic gain control circuit.

What is claimed is:

1. An automatic gain control circuit comprising:

a voltage amplifier circuit including an operational amplifier having an input terminal and an output terminal;

a direct current bias terminal that applies a predetermined direct current bias to said voltage amplifier circuit;

an input signal-attenuating circuit including an input resistance serially connected to said input terminal of said voltage amplifier circuit, and a MOS transistor connected between said input terminal of said voltage amplifier circuit and said direct current bias terminal, said MOS transistor having a gate;

a current mirror type differential amplifier circuit having an input terminal thereof connected to said output terminal of said voltage amplifier circuit, and another input terminal thereof disposed to be supplied with a predetermined reference voltage which is lower than a voltage of said predetermined direct current bias from said direct current bias terminal, said differential amplifier circuit having an output terminal for outputting an output which is inverted when a voltage level of said output signal from said voltage amplifier circuit lowers below said predetermined reference voltage; and a time constant circuit having an input terminal thereof connected to said output terminal of said differential amplifier circuit, and an output terminal thereof connected to said gate of said MOS transistor of said input signal-attenuating circuit, said time constant circuit being responsive to said output from said differential amplifier circuit, that delivers a control signal to said gate of said MOS transistor of said input signal-attenuating circuit to thereby cause progressive decrease of on-state resistance of said MOS transistor when said output from said differential amplifier circuit is inverted.

2. An automatic gain control circuit as claimed in claim 1, further including a back bias terminal, and wherein said MOS transistor of said input signal-attenuating circuit has a substrate region, said back bias terminal supplying a back bias to said substrate region of said MOS transistor.

* * * * *